(12) United States Patent
Chung et al.

(10) Patent No.: US 8,309,282 B2
(45) Date of Patent: Nov. 13, 2012

(54) APPARATUS AND METHOD FOR ALIGNING MASK

(75) Inventors: Kyung-Hoon Chung, Yongin (KR); Hyung-Min Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 228 days.

(21) Appl. No.: 12/880,226

(22) Filed: Sep. 13, 2010

(65) Prior Publication Data

US 2011/0076599 A1 Mar. 31, 2011

(30) Foreign Application Priority Data

Sep. 25, 2009 (KR) .......................... 10-2009-0091321

(51) Int. Cl.
*G03F 9/00* (2006.01)
*G01N 21/00* (2006.01)
*G01N 23/00* (2006.01)

(52) U.S. Cl. .......... 430/22; 430/30; 430/394; 250/491.1
(58) Field of Classification Search ................... 430/22, 430/30, 394; 250/491.1
See application file for complete search history.

(56) References Cited

U.S. PATENT DOCUMENTS

| 5,863,680 | A | 1/1999 | Kawakubo et al. |
| 2009/0258142 | A1 | 10/2009 | An et al. |
| 2009/0309109 | A1 | 12/2009 | Chang et al. |
| 2009/0317562 | A1 | 12/2009 | Dieguez-Campo et al. |

FOREIGN PATENT DOCUMENTS

| JP | 2008004358 | | 1/2008 |
| KR | 1997-0022573 | A | 5/1997 |
| KR | 10-0426152 | B1 | 4/2004 |
| KR | 10-2006-0080467 | A | 7/2006 |
| KR | 10-2006-0123944 | | 12/2006 |
| KR | 10-2007-0046375 | | 5/2007 |
| KR | 10-2008-0093378 | | 10/2008 |

*Primary Examiner* — Christopher Young
(74) *Attorney, Agent, or Firm* — Robert E. Bushnell, Esq.

(57) ABSTRACT

An apparatus and method for aligning a mask that includes disposing and firstly aligning a mask over a first substrate, with a space interposed therebetween, bringing the mask into contact with the first substrate and then measuring the alignment state of the mask with respect to the first substrate to detect an alignment error, secondly aligning the mask with respect to the first substrate based on the alignment error, transferring the first substrate to the next process, disposing and thirdly aligning the mask over a second substrate with the space interposed therebetween, and bringing the mask into contact with the second substrate.

20 Claims, 8 Drawing Sheets

APPARATUS AND METHOD FOR ALIGNING MASK

CLAIM OF PRIORITY

This application makes reference to, incorporates into this specification the entire contents of, and claims all benefits accruing under 35 U.S.C. §119 from an application earlier filed in the Korean Intellectual Property Office filed on 25 Sep. 2009, and there duly assigned Serial No. 10-2009-0091321.

BACKGROUND OF THE INVENTION

1. Field of the Invention

The general inventive concept relates to an apparatus and method for aligning a mask.

2. Description of the Related Art

A display device is a device that displays an image. Recently, an organic light emitting diode display has been drawing attention.

The organic light emitting diode display has a self-luminous characteristic, and since it does not need a separate light source, unlike a liquid crystal display, it can have a relatively small thickness and weight. In addition, since the organic light emitting diode display exhibits high-quality characteristics such as low power consumption, high luminance, high response speed, etc., it is receiving much attention as a next-generation display device for portable electronic appliances.

The above information disclosed in this Related Art section is only for enhancement of understanding of the background of the described technology and therefore it may contain information that does not form the prior art that is already known in this country to a person of ordinary skill in the art.

SUMMARY OF THE INVENTION

The described technology has been made in an effort to solve the aforementioned problem of the background art, and to provide an apparatus and method for aligning a mask that can suppress an alignment error of the mask with respect to a substrate.

A first aspect of the present invention provides a method for aligning a mask, including: disposing and firstly aligning a mask over a first substrate, with a space interposed therebetween; bringing the mask into contact with the first substrate and then measuring the alignment state of the mask with respect to the first substrate to detect an alignment error; secondly aligning the mask with respect to the first substrate based on the alignment error; transferring the first substrate to the next process; disposing and thirdly aligning the mask over a second substrate with a space interposed therebetween; and bringing the mask into contact with the second substrate, wherein the third alignment involves aligning the mask in the second alignment state with respect to the second substrate.

The first alignment may involve initially aligning the mask with respect to the first substrate based on a first alignment value that is set and stored.

The value of the detected alignment error may be stored.

The second alignment may involve realigning the mask contacting the first substrate with respect to the first substrate so as to be spaced apart by a predetermined gap from the first substrate.

The predetermined gap may refer to a gap with a width in one direction that is smaller than the space.

The second alignment may be performed a plurality of times.

The third alignment may involve initially aligning the mask with respect to the second substrate based on a third alignment value obtained by comparing the first alignment and the second alignment.

The third alignment value may be obtained by subtracting the value of the alignment error from the first alignment value.

The third alignment may involve sequentially performing the first and second alignments of the mask on the second substrate.

The method may further include: transferring the second substrate to the next process; disposing and fourth aligning the mask over a third substrate, with a space interposed therebetween; and bringing the mask into contact with the third substrate, wherein the fourth alignment may involve aligning the mask in the third alignment state with respect to the third substrate.

The method may further include measuring the alignment state of the mask with respect to the second substrate.

A second aspect of the present invention provides an apparatus for aligning a mask, including: a substrate support for supporting a substrate; a mask support for supporting a mask; a driver for driving the mask support; a measuring unit for measuring the alignment state of the mask with respect to the substrate; and a controller for obtaining a compensated alignment value according to the alignment state measured by the measuring unit and controlling the driver by the compensated alignment value to control the alignment of the mask with respect to the substrate, wherein the compensated alignment value is obtained based on an alignment error detected by measuring the alignment state of the mask with respect to the substrate, which is measured in the previous process among a plurality of repeated processes.

The controller may transmit a driving signal based on the set alignment value to the driver to control the mask supported by the mask support to be initially aligned with respect to the substrate.

The controller may transmit a new driving signal to the driver according to the alignment state of the mask measured by the measuring unit to control the mask supported by the mask support to be realigned with respect to the substrate.

In accordance with the present invention, an alignment error of the mask with respect to the substrate is suppressed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 is a view schematically showing an apparatus for aligning a mask according to a first exemplary embodiment.

FIG. 2 is a flowchart showing a method for aligning a mask in accordance with a second exemplary embodiment.

FIGS. 3 to 7 are views illustrating the mask aligning method in accordance with the second exemplary embodiment.

FIG. 8 is a flowchart showing a method for aligning a mask in accordance with a third exemplary embodiment.

DETAILED DESCRIPTION

Hereinafter, exemplary embodiments will be described in detail with reference to the accompanying drawings such that those skilled in the art can easily carry out the present invention. The present invention may be embodied in various different forms, and is not to be construed as being limited to the embodiments set forth herein.

Constituent elements having the same structures throughout the embodiments are denoted by the same reference numerals and are described in a first exemplary embodiment. In the other exemplary embodiments, only constituent elements other than the same constituent elements are described.

To clearly describe the exemplary embodiments, parts not related to the description are omitted, and like reference numerals designate like constituent elements throughout the specification.

In the drawings, the sizes and thicknesses of the components are merely shown for convenience of explanation, and therefore the present invention is not necessarily limited to the illustrations described and shown herein.

In the drawings, thicknesses are enlarged to clearly express various layers and areas. In the drawings, the thicknesses of some layers and areas are exaggerated for convenience of explanation. When it is described that one element such as a layer, a film, an area, a plate, etc. is formed on another element, it means that one element exists directly on another element or that one element exists on another element with a further element therebetween. On the other hand, when it is described that one element is formed directly on another element, it generally means that no other element exists therebetween.

A conventional organic light emitting diode (OLED) display includes a first electrode layer formed in a predetermined pattern on a transparent insulation substrate, an organic emission layer formed on the first electrode, and a second electrode layer formed on the organic emission layer. Among them, the organic emission layer and the second electrode layer can be formed by a method such as a deposition process.

A deposition process in the conventional OLED display is performed by aligning and attaching a mask including an open area on a substrate, the open area corresponding to a predetermined pattern to be formed on the substrate, and controlling an evaporated pattern forming material so as to be deposited on the substrate through the open area. In such a deposition process, it is important to align and attach a mask in a normal position on the substrate without any error.

However, the mask in this conventional approach is aligned in a normal position with respect to the substrate when aligning the mask on the substrate, and the mask is moved toward the substrate to bring the mask into contact with the substrate to attach the mask thereto. Thus, a slight error may occur in the alignment of the mask with respect to the substrate due to the movement.

Now, an apparatus for aligning a mask according to a first exemplary embodiment will be described with reference to FIG. 1.

Figure 1:
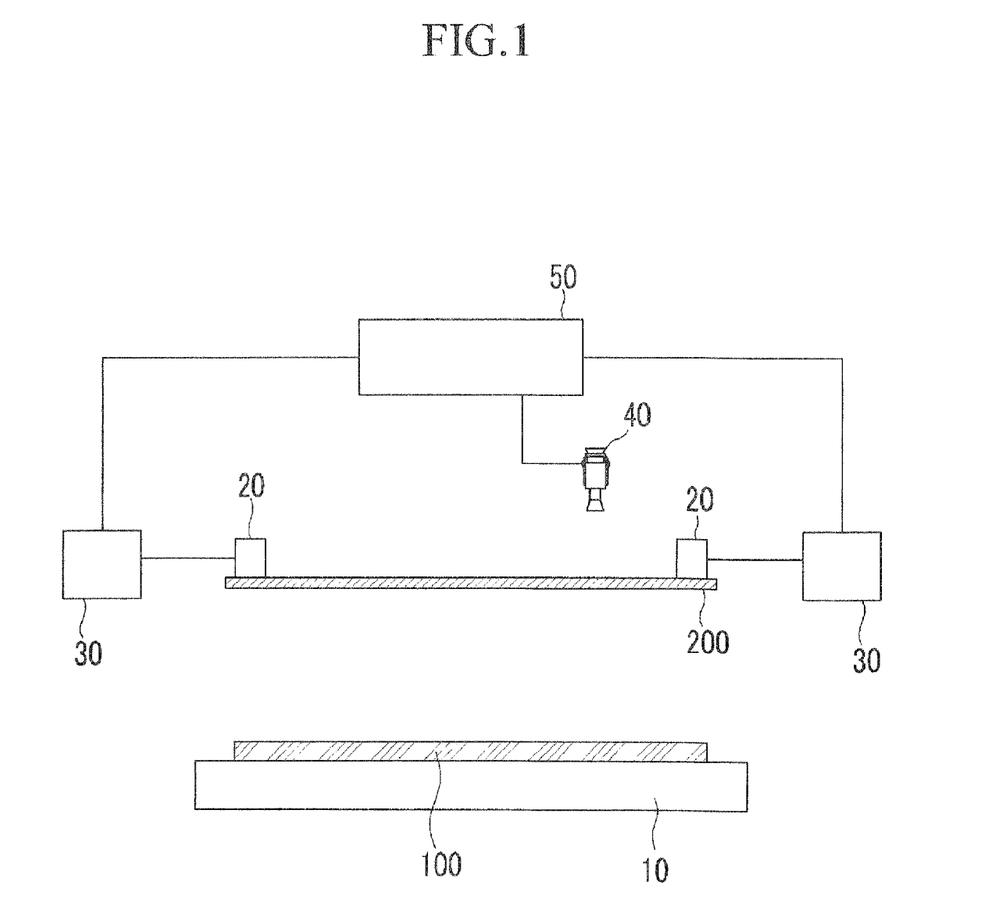

FIG. 1 is a view schematically showing an apparatus for aligning a mask according to a first exemplary embodiment.

As shown in FIG. 1, the mask aligning apparatus according to the first exemplary embodiment includes a substrate support 10, a mask support 20, a driver 30, a measuring unit 40, and a controller 50.

The substrate support 10 is a support member that supports a substrate 100 to be deposited. Although FIG. 1 illustrates the substrate 100 as being simply situated on the substrate support 10, this illustration is merely an example. For example, the substrate support 10 may be a vacuum means etc. for introducing the substrate 100 into a deposition chamber (not shown) that performs deposition.

The substrate 100, which is one example of a flat panel display, is a substrate for forming an organic light emitting diode display (not shown) thereon. Although not shown in FIG. 1, a first electrode layer functioning as an anode electrode is formed on the substrate 100, an organic emission layer is formed on the first electrode layer, and a second electrode layer functioning as a cathode electrode is formed on the organic emission layer.

The first electrode layer may be formed in a predetermined pattern on the substrate 100 by vacuum deposition or sputtering, and the second electrode layer may be formed in a predetermined pattern by vacuum deposition after the formation of the first electrode and the organic emission layer. Moreover, the organic emission layer may be formed by deposition, spin coating, inkjet printing, etc. The organic emission layer preferably has a multi-deposited film structure including at least an emission layer. For example, an electron transfer layer (ETL) may be disposed between the second electrode layer and the organic emission layer, a hole transfer layer (HTL) may be disposed between the first electrode layer and the organic emission layer, a hole injection layer (HIL) may be disposed between the first electrode layer and the hole transfer layer, and an electron injection layer (EIL) may be disposed between the second electrode layer and the electron transfer layer. Due to this multi-layered film structure, holes and electrons can be transferred more smoothly into the organic emission layer.

The above-stated organic light emitting diode display may be a passive matrix type or an active matrix type. The active matrix type of organic light emitting diode display has a plurality of thin-film transistors for controlling the light emission of the organic emission layer on the substrate.

In fabricating the organic light emitting diode display having the above configuration, in order to form electrode layers and an organic emission layer in a predetermined pattern, a mask 200 having an open area corresponding to each pattern is used in a process employing deposition. The mask 200 is supported by the mask support 20.

The mask support 20 is a support member that supports the mask 200. Although FIG. 1 illustrates the mask 200 as being simply attached to the mask support 20, this illustration is merely an example. For example, the mask support 20 may be a vacuum means etc. for attaching to the mask 200.

The mask 200 supported by the mask support 20 includes an open region formed corresponding to the pattern of a target to be deposited, and the open region may include a plurality of slits formed through the mask 200. The open area of the mask 200 may have a pattern corresponding to the first electrode layer, the organic emission layer, and the second electrode layer. For better understanding and ease of description, the shape of this pattern is not shown in the drawings.

The mask support 20 is connected to the driver 30. The driver 30 is electrically connected to the mask support 20 and the controller 50, and serves to drive the mask support 20.

Here, driving involves moving the mask 200 toward the substrate 100 so as to align the mask 200 with respect to the substrate 100 or bring the mask 200 into contact with the substrate 100.

The driver 30 drives the mask support 20. As the mask support 20 is driven, the mask 200 supported by the mask support 20 is aligned with respect to the substrate 100 or moved toward the substrate 100 and brought into contact with the substrate 100. When the mask 200 is brought into contact with the substrate 100 by the driver 30, the alignment state of the mask 200 with respect to the substrate 100 is measured by the measuring unit 40.

The measuring unit 40 measures the alignment state of the mask 200 with respect to the substrate 100 by a measurement means, such as a camera or laser, when the mask 200 is brought into contact with the substrate 100. A check on the alignment state of the mask 200 with respect to the substrate 100 can be performed by checking matching between alignment marks formed on the substrate 100 and the mask, respectively. The alignment state of the mask 200 with respect to the substrate 100, which is measured by the measuring unit 40, is converted into data and transmitted to the controller 50.

The controller 50 transmits a driving signal based on an initially set alignment value to the driver 30 and controls the mask 200 supported by the mask support 20 to be initially aligned with respect to the substrate 100.

Here, the initial alignment involves aligning the mask 200 with respect to the substrate 100, with a space interposed between the substrate 100 and the mask 200.

Moreover, the controller 50 transmits a new driving signal to the driver 30 depending on the alignment state of the mask 200 with respect to the substrate 100, which is measured by the measuring unit 40, and controls the mask 200 supported by the mask support 20 to be realigned with respect to the substrate 100.

Here, the realignment involves realigning the mask 200 contacting the substrate 100 so as to be spaced apart by a predetermined gap from the substrate 100.

Further, the controller 50 stores data of the alignment state of the mask 200 with respect to the substrate 100 measured by the measuring unit 40, and obtains a compensated alignment value based on the stored data. The compensated alignment value obtained by the controller 50 is applied to a new substrate to be used in the following process. The controller 50 transmits a driving signal based on the compensated alignment value to the driver 30 in the following process using a new substrate, and controls the mask 200 to be initially aligned with respect to the substrate 100. That is, the compensated alignment value obtained by the controller 50 is obtained based on an alignment error detected by measuring the alignment state of the mask 200 with respect to the substrate 100, which is measured in the previous process among a plurality of repeated processes, and this compensated alignment value is applied in the following process.

As stated above, the mask aligning apparatus according to the first exemplary embodiment can perform new compensated alignment of the mask 200 with respect to the substrate 100 by using a compensated alignment value obtained by comparing the alignment states in neighboring processes among a plurality of repeated processes during the initial alignment of the mask 200 with respect to the substrate 100. That is, by performing new compensated alignment of the mask 200 with respect to the substrate 100 by the mask aligning apparatus, an alignment error of the mask 200 with respect to the substrate 100 is suppressed.

Now, a method for aligning a mask in accordance with a second exemplary embodiment will be described with reference to FIGS. 2 to 7.

Figure 2:
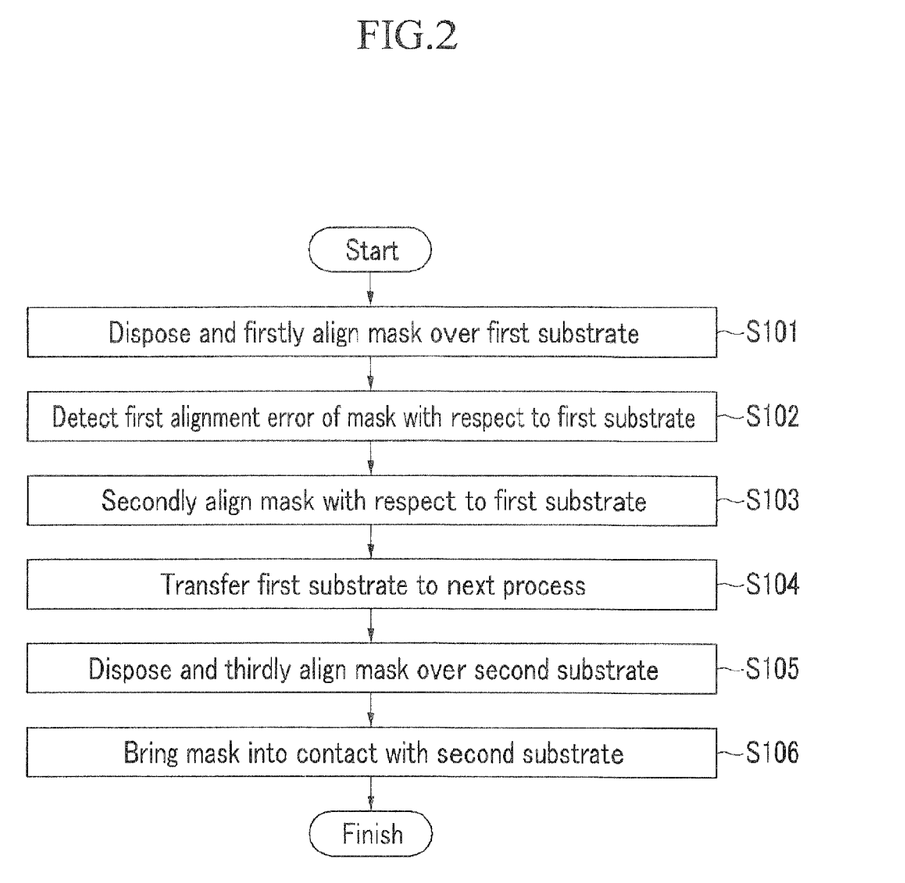

FIG. 2 is a flowchart showing a method for aligning a mask in accordance with a second exemplary embodiment. FIGS. 3 to 7 are views illustrating the mask aligning method in accordance with the second exemplary embodiment.

Figure 3:
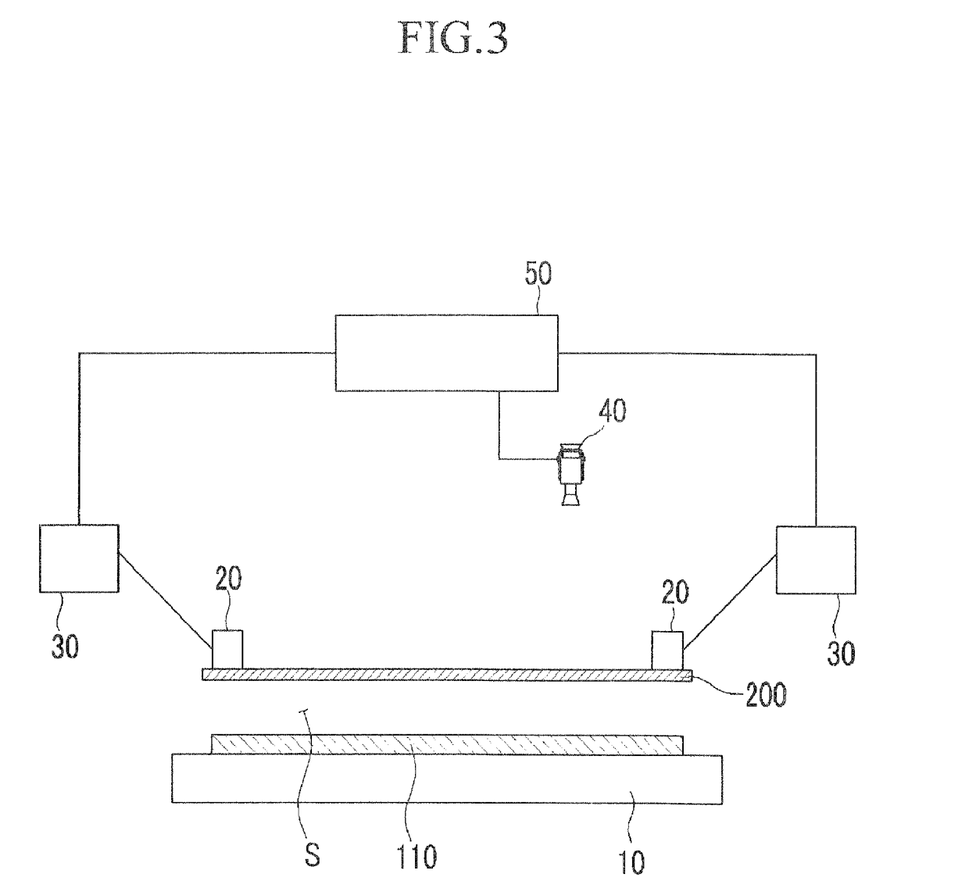

Firstly, as shown in FIGS. 2 and 3, a mask 200 is disposed and firstly aligned over a first substrate 110 (S101).

Still further, in order to contact and attach the mask 200 to the first substrate 110, the first substrate 110 is loaded in a chamber such as a deposition chamber, and the mask 200 is disposed over the first substrate 110 with a space S interposed therebetween, thereby first aligning the mask 200 with respect to the first substrate 110.

The first alignment of the mask 200 with respect to the first substrate 110 is performed by transmitting a driving signal based on a first alignment value set and stored in the controller 50 to the driver 30.

Here, the first alignment involves initially aligning the mask 200 over the first substrate 110 with the space S interposed therebetween for a deposition process to form a pattern.

Figure 4:
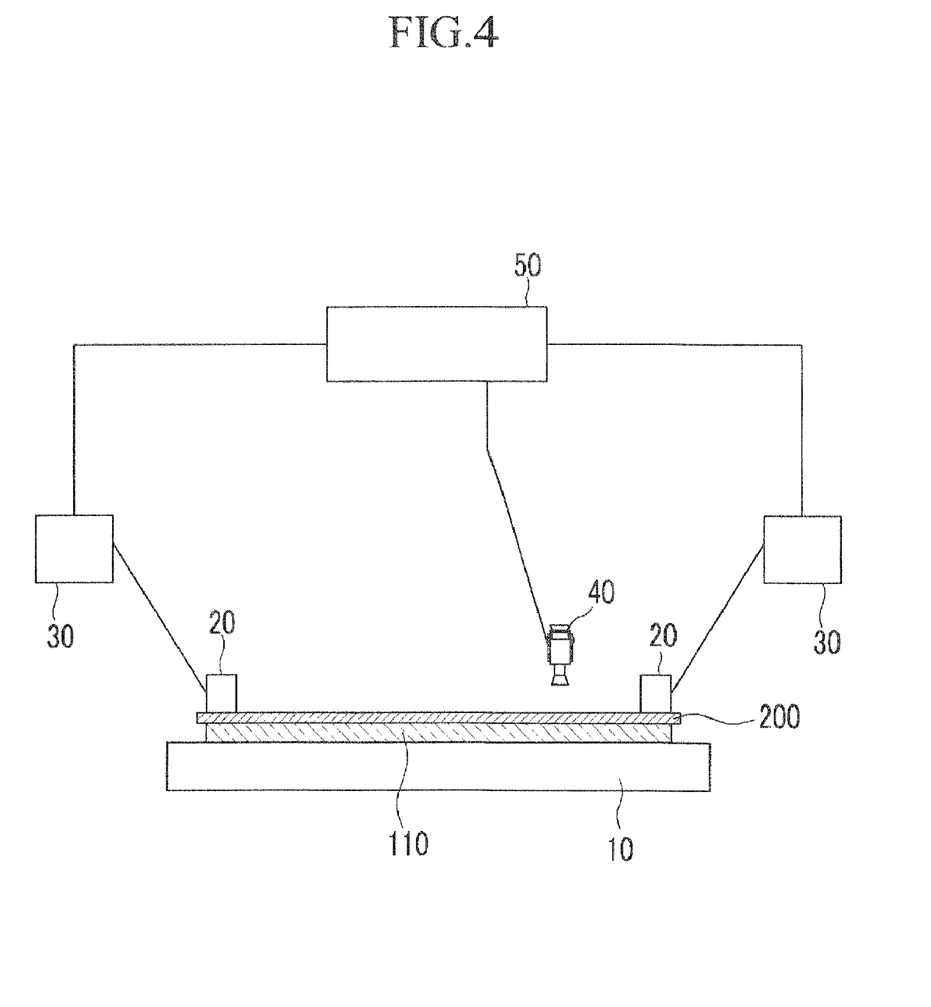

Next, as shown in FIG. 4, the mask 200 is brought into contact with the first substrate 110, and then the alignment state of the mask 200 with respect to the first substrate 110 is measured to detect an alignment error (S102).

Still further, the mask 200 that is first aligned over the first substrate 110 with a space S interposed therebetween is brought into contact with the first substrate 110 in order to attach the mask 200 to the first substrate 110, and then the alignment state of the mask 200 with the first substrate 110 is measured by a measuring means of the measuring unit 40. At this point, because the mask 200 has been moved by the space S so as to contact the first substrate 110, a slight error may occur in the alignment of the mask 200 with respect to the first substrate 110, and the measuring unit 40 detects this slight error as an alignment error of the mask 200 with respect to the first substrate 110.

The value of the alignment error detected by the measuring unit 40 is transmitted to the controller 50 and stored in the controller 50.

Figure 5:
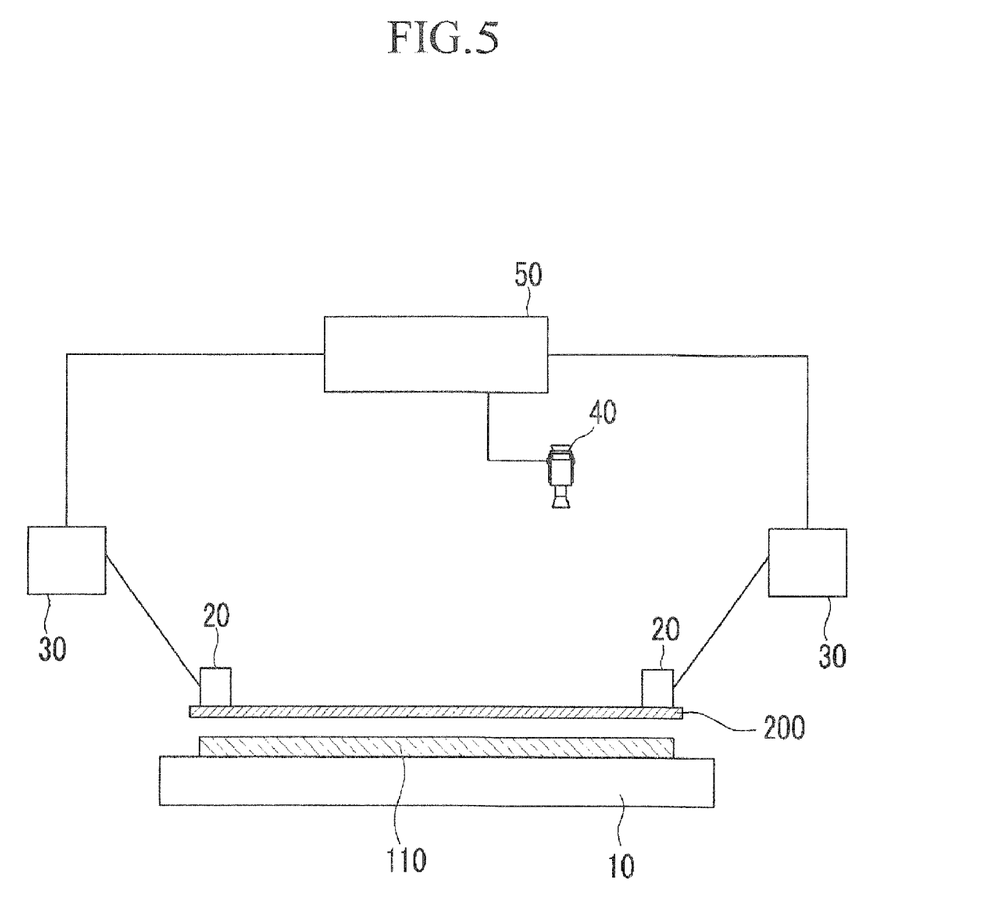

Next, as shown in FIG. 5, the mask 200 is secondly aligned with respect to the first substrate 110 based on the alignment error (S103).

Still further, in order to prevent damage to the pattern formed on the first substrate 110, the mask 200 is spaced by a predetermined gap apart from the first substrate 110, and then the mask 200 is secondly aligned with respect to the first substrate 110 based on the alignment error. Here, the predetermined gap refers to the gap with a width in one direction that is smaller than the aforementioned space S.

That is, the second alignment refers to realigning the mask 200 contacting the first substrate 110 with respect to the first substrate 110 so as to be spaced apart by a predetermined gap from the first substrate 110.

The second alignment is performed by transmitting a new driving signal from the controller 50 to the driver 30 according to the alignment state of the mask 200 with respect to the first substrate 110 measured by the measuring unit 40, and realigning the mask 200 supported by the mask support 20 with respect to the first substrate 110.

The second alignment of the mask 200 with respect to the first substrate 110 can be performed a plurality of times until the mask 200 is aligned in a normal position with respect to the first substrate 110 after the mask 200 is brought into contact with the first substrate 110.

Next, the first substrate 110 is transferred to the next process (S104).

Still further, after performing the second alignment of the mask 200 with respect to the first substrate 110, the mask 200 is contacted and attached to the first substrate 110, and a pattern is formed on the first substrate 110 through the mask 200. After a pattern is formed on the first substrate 110 and the mask 200 is removed from the first substrate 110, the first substrate 110 having the pattern formed thereon is transferred to the next process.

Here, the next process refers to a process such as washing the first substrate 110, followed by deposition.

Figure 6:
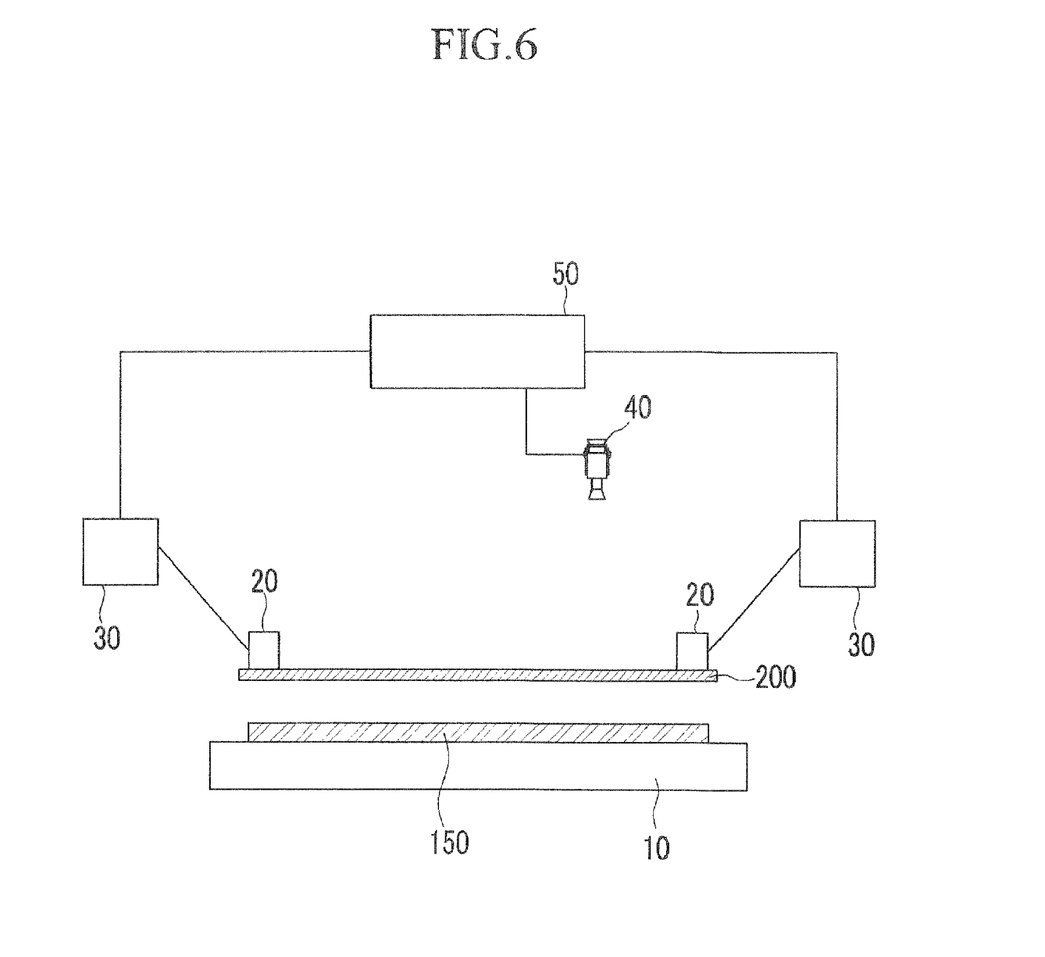

Next, as shown in FIG. 6, the mask 200 is disposed and thirdly aligned over a second substrate 150 (S105).

Still further, in order to contact and attach the mask 200 to the second substrate 150, which is a new substrate, the second substrate 150 is loaded in a chamber and the mask 200 is disposed over the second substrate 150 with a space S interposed therebetween, thereby thirdly aligning the mask 200 with respect to the second substrate 150.

Here, the third alignment involves initially aligning the mask 200 over the second substrate 150 with the space S interposed therebetween for a deposition process to form a pattern.

The third alignment of the mask 200 with respect to the second substrate 150 is performed by transmitting a driving signal from the controller 50 to the driver 30, the driving signal being based on a third alignment value obtained by the controller 50 by comparing the first alignment value set and stored in the controller 50 and the value of the alignment error detected by the measuring unit 40 and stored in the controller 50. The third alignment value obtained by the controller 50 is stored in the controller 50.

The comparison between the first alignment value and the value of the alignment error involves subtracting the value of the alignment error from the first alignment value. That is, the third alignment value for the third alignment is obtained by subtracting the value of the alignment error from the first alignment value, and the third alignment based on the third alignment value involves aligning the mask 200 in the second alignment state with respect to the second substrate 150.

In short, the third alignment of the mask 200 with respect to the second substrate 150 is a process of performing alignment with respect to the first and second alignments of the mask 200 to the first substrate 110 that were performed in the previous process. The moving amount of the mask 200 associated with the third alignment is determined by subtracting the moving amount of the mask 200 during the second alignment from the moving amount of the mask 200 during the first alignment with respect to the first substrate 110, which is the previous substrate, and the third alignment of the mask 200 with respect to the second substrate 150, which is the subsequent substrate, is performed. Thus, compared to the first alignment, which is the initial alignment of the mask 200 with respect to the first substrate 110, the mask 200 is better aligned in a normal position with respect to the substrate in the third alignment, which is the initial alignment of the mask 200 with respect to the second substrate 150.

In another exemplary embodiment, the third alignment of the mask 200 with respect to the second substrate 150 can be performed by sequentially performing the above-described first and second alignments. More specifically, the third alignment can be performed after the mask 200 is firstly aligned and then secondly aligned over the second substrate 150.

Figure 7:
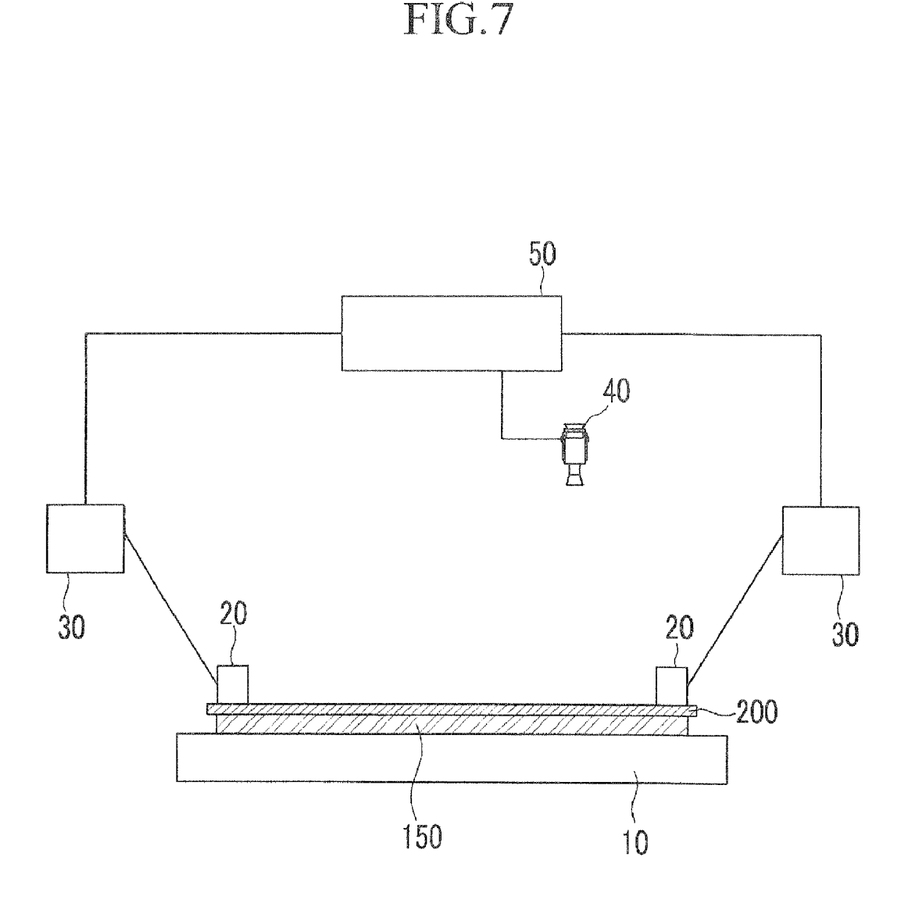

Next, as shown in FIG. 7, the mask 200 is brought into contact with the second substrate 150 (S106).

Still further, in order to attach the mask 200 to the second substrate 150, the mask 200 that is thirdly aligned over the second substrate 150 with a space S interposed therebetween is brought into contact with the second substrate 150, and then the mask 200 is attached to the second substrate 150. At this point, the alignment state of the mask 200 with respect to the second substrate 150 can be measured by the measuring unit 40, and if an alignment error of the mask 200 occurs with respect to the second substrate 150, the above-described process can be performed again on third to N-th substrates subsequent to the second substrate.

As seen above, the mask aligning method in accordance with the second exemplary embodiment can suppress an increase in manufacturing time and cost due to the realignment of the mask 200 with respect to the substrate by performing the third alignment, which is the initial alignment of the mask 200 with respect to the second substrate 150, which is the substrate subsequent to the first substrate 110, based on the error of the alignment performed on the first substrate 110.

Now, a method for aligning a mask in accordance with a third exemplary embodiment will be described with reference to FIG. 8.

Figure 8:
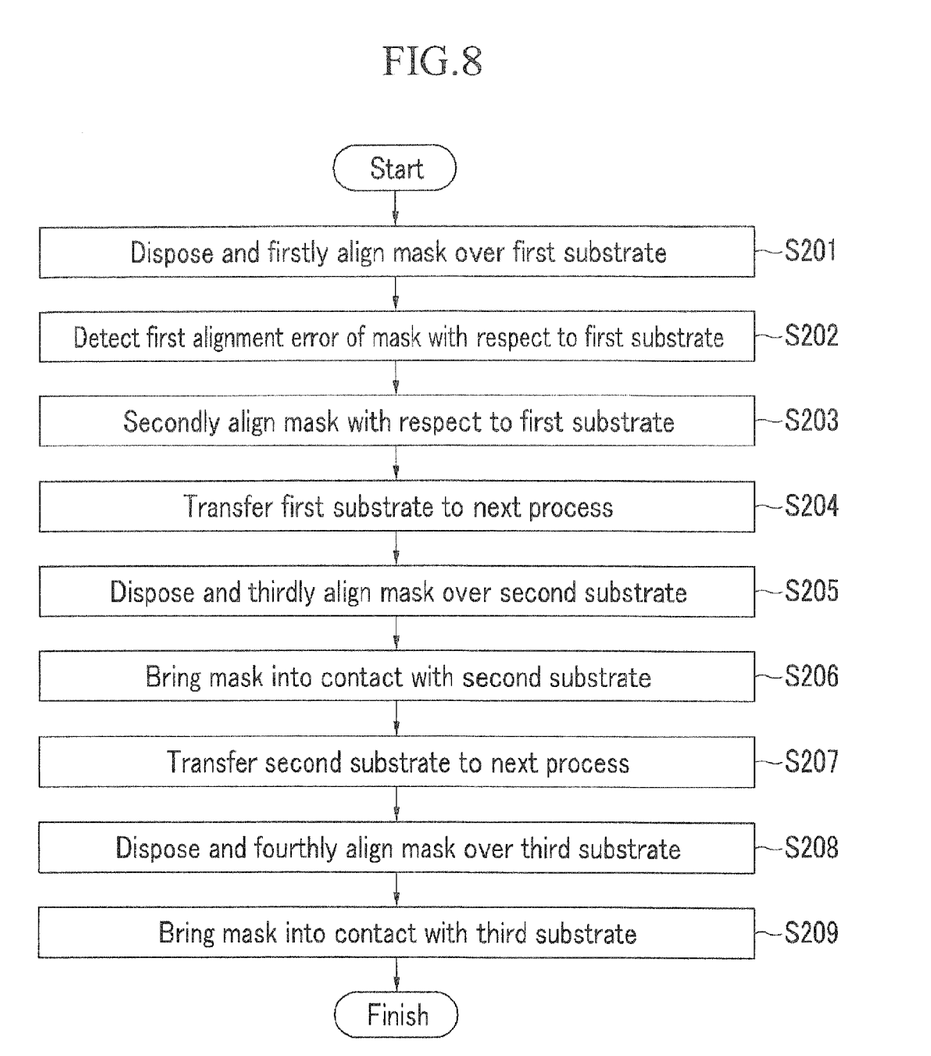

FIG. 8 is a flowchart showing a method for aligning a mask in accordance with a third exemplary embodiment.

Firstly, as shown in FIG. 8, a mask 200 is disposed and firstly aligned over a first substrate 110 (201).

The mask 200 is then brought into contact with the first substrate 110, and the alignment state of the mask 200 with respect to the first substrate 110 is measured to detect an alignment error (S202).

Next, the mask 200 is secondly aligned with respect to the first substrate 110 based on the alignment error (S203).

The first substrate 110 is then transferred to the next process (S204).

Next, the mask 200 is disposed and thirdly aligned over a second substrate 150 (S205).

The mask 200 is then brought into contact with the second substrate 105 (S206).

Next, the second substrate 150 is transferred to the next process (S207).

Still further, after performing the third alignment of the mask 200 with respect to the second substrate 150, the mask 200 is contacted and attached to the second substrate 150, and a pattern is formed on the second substrate 150 through the mask 200. After the pattern is formed on the second substrate 150 and the mask 200 is removed from the second substrate 150, the second substrate 150 having the pattern formed thereon is transferred to the next process.

Here, the next process refers to a process such as washing the second substrate 150, followed by deposition.

Next, the mask 200 is disposed and fourthly aligned over a third substrate (S208).

Still further, in order to contact and attach the mask 200 to the third substrate, which is a new substrate, the third substrate 150 is loaded in a chamber and the mask 200 is disposed over the third substrate 150 with a space S interposed therebetween, thereby fourth aligning the mask 200 with respect to the third substrate 150.

Here, the fourth alignment involves initially aligning the mask 200 over the third substrate with the space S interposed therebetween for a deposition process to form a pattern.

The fourth alignment of the mask 200 with respect to the third substrate is substantially identical to the above-described third alignment of the mask 200 with respect to the second substrate 150. That is, the fourth alignment of the mask 200 with respect to the third substrate involves aligning the mask 200 in the second alignment state with respect to the third substrate.

Next, the mask 200 is brought into contact with the third substrate (S209).

Still further, in order to attach the mask 200 to the third substrate, the mask 200 is fourthly aligned over the third substrate with a space S interposed therebetween, is brought into contact with the third substrate, and then the mask 200 is attached to the third substrate. At this point, the alignment state of the mask 200 with respect to the third substrate can be measured by the measuring unit 40, and if an alignment error of the mask 200 occurs with respect to the third substrate, the above-described process can be performed again.

As seen above, the mask aligning method in accordance with the third exemplary embodiment can suppress an increase in manufacturing time and cost due to the realignment of the mask 200 with respect to the substrate by performing the third and fourth alignments, which are the initial alignments of the mask 200 with respect to the second substrate 150 and the third substrate, which are the substrates subsequent to the first substrate 110, based on the error of the alignment performed on the first substrate 110.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for aligning a mask, comprising:
disposing and firstly aligning a mask over a first substrate, with a space interposed between the mask and the first substrate to create a first alignment state;
bringing the mask into contact with the first substrate and then measuring the first alignment state of the mask with respect to the first substrate to detect an alignment error;
aligning the mask with respect to the first substrate to create a second alignment state based on the alignment error;
transferring the first substrate to a next process;
disposing and aligning the mask over a second substrate with a space interposed between the mask and the second substrate creating a third alignment state; and
bringing the mask into contact with the second substrate,
wherein the creation of the third alignment state involves aligning the mask in the second alignment state with respect to the second substrate.

2. The method of claim 1, wherein the first alignment state involves initially aligning the mask with respect to the first substrate based on a first alignment value that is set and stored.

3. The method of claim 2, wherein the value of the detected alignment error is stored.

4. The method of claim 3, wherein the second alignment state involves realigning the mask contacting the first substrate with respect to the first substrate so as to be spaced apart by a predetermined gap from the first substrate.

5. The method of claim 4, wherein the predetermined gap refers to a gap with a width in one direction that is smaller than the space.

6. The method of claim 5, wherein the second alignment state is performed a plurality of times.

7. The method of claim 6, wherein the third alignment state involves initially aligning the mask with respect to the second substrate based on a third alignment value obtained by comparing the first alignment state and the second alignment state.

8. The method of claim 7, wherein the third alignment value is obtained by subtracting the value of the alignment error from the first alignment value.

9. The method of claim 1, wherein the third alignment state involves sequentially performing the first and second alignments in the first and second alignment states of the mask on the second substrate.

10. The method of claim 1, further comprising:
transferring the second substrate to a next process;
disposing and aligning the mask over a third substrate in a fourth alignment state, with a space interposed between the mask and the third substrate; and
bringing the mask into contact with the third substrate,
wherein the fourth alignment state involves aligning the mask in the third alignment state with respect to the third substrate.

11. The method of claim 1, further comprising:
measuring the alignment state of the mask with respect to the second substrate.

12. An apparatus for aligning a mask, comprising:
a substrate support to support a substrate;
a mask support to support a mask;
a driver for driving the mask support;
a measuring unit that measures an alignment state of the mask with respect to the substrate; and
a controller that determines a compensated alignment value according to the alignment state measured by the measuring unit and controlling the driver by the compensated alignment value to control the alignment of the mask with respect to the substrate,
wherein the compensated alignment value is obtained based on an alignment error detected by measuring the alignment state of the mask with respect to the substrate, which is measured in a previous process among a plurality of repeated processes.

13. The apparatus of claim 12, wherein the controller transmits a driving signal based on the set alignment value to the driver to control the mask supported by the mask support to be initially aligned with respect to the substrate.

14. The apparatus of claim 13, wherein the controller transmits a new driving signal to the driver according to the alignment state of the mask measured by the measuring unit to control the mask supported by the mask support to be realigned with respect to the substrate.

15. A method for aligning a mask, comprising:
disposing and aligning a mask over a first substrate, with a space interposed between the mask and the first substrate to create a first alignment state;
bringing the mask into contact with the first substrate and then measuring the first alignment state of the mask with respect to the first substrate to detect an alignment error;
aligning the mask with respect to the first substrate to create a second alignment state based on the alignment error;
transferring the first substrate to a next process;
disposing and aligning the mask over a second substrate with a space interposed between the mask and the second substrate creating a third alignment state;
bringing the mask into contact with the second substrate, transferring the second substrate to a next process;
disposing and aligning the mask over a third substrate in a fourth alignment state, with a space interposed between the mask and the third substrate; and
bringing the mask into contact with the third substrate,
wherein the creation of the third alignment state involves aligning the mask in the second alignment state with respect to the second substrate,
wherein the fourth alignment state involves aligning the mask in the third alignment state with respect to the third substrate,
wherein the mask is a same mask or a different mask.

16. The method of claim 15, wherein the second alignment state involves realigning the mask contacting the first substrate with respect to the first substrate so as to be spaced apart by a predetermined gap from the first substrate.

17. The method of claim 16, wherein the predetermined gap refers to a gap with a width in one direction that is smaller than the space.

18. The method of claim 17, wherein the second alignment state is performed a plurality of times.

19. The method of claim 18, wherein the third alignment state involves initially aligning the mask with respect to the second substrate based on a third alignment value obtained by comparing the first alignment state and the second alignment state.

20. The method of claim 19, wherein the third alignment value is obtained by subtracting the value of the alignment error from the first alignment value.

* * * * *